United States Patent
Desplats et al.

(10) Patent No.: US 7,408,342 B2
(45) Date of Patent: Aug. 5, 2008

(54) DEVICE FOR MEASURING A COMPONENT OF CURRENT BASED ON MAGNETIC FIELDS

(75) Inventors: Romain Desplats, Toulouse (FR); Olivier Crepel, La Salvetat Saint Gilles (FR); Felix Beaudoin, Baziege (FR); Philippe Perdu, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 10/575,012

(22) PCT Filed: Oct. 8, 2004

(86) PCT No.: PCT/FR2004/002560
§ 371 (c)(1),
(2), (4) Date: Jul. 5, 2006

(87) PCT Pub. No.: WO2005/036193
PCT Pub. Date: Apr. 21, 2005

(65) Prior Publication Data
US 2007/0108975 A1    May 17, 2007

(30) Foreign Application Priority Data
Oct. 8, 2003    (FR) .................................. 03 11773

(51) Int. Cl.
*G01R 33/02*    (2006.01)
(52) U.S. Cl. ........................ 324/247; 324/252; 324/258; 324/750

(58) Field of Classification Search ............ 324/207.21, 324/244, 247, 249, 251, 252, 258, 260, 262, 324/263, 500, 537, 750, 763
See application file for complete search history.

(56) References Cited

U.S. PATENT DOCUMENTS

| | | | |
|---|---|---|---|
| 5,132,620 A | | 7/1992 | Rempt |
| 5,644,230 A | * | 7/1997 | Pant et al. .................... 324/247 |
| 6,191,581 B1 | * | 2/2001 | Van Dau et al. ............. 324/249 |
| 6,297,630 B1 | * | 10/2001 | Dietzel et al. ................ 324/210 |
| 6,304,082 B1 | * | 10/2001 | Gualtieri et al. ............. 324/252 |
| 6,427,314 B1 | | 8/2002 | Acker |
| 7,126,330 B2 | * | 10/2006 | Peczalski et al. ............ 324/247 |
| 7,173,420 B2 | * | 2/2007 | Tamura ....................... 324/247 |
| 2002/0167313 A1 | | 11/2002 | Taimisto |

FOREIGN PATENT DOCUMENTS

DE    197 25 200    8/1998

* cited by examiner

*Primary Examiner*—Jay M Patidar
(74) *Attorney, Agent, or Firm*—Young & Thompson

(57) ABSTRACT

A magnetic-field-measuring probe includes at least two magnetoresistive sensors which are sensitive to respective magnetic fields along a determined measurement axis. The at least two magnetoresistive sensors are rigidly connected to one another in a position such that the measurement axes thereof are at an angle other than zero. Output terminals specific to each magnetoresistive sensor are used to supply a signal that is representative of the field measured by each sensor along the measurement axis thereof. The difference between the derivative of a first magnetic field relative to a second direction and the derivative of a second magnetic field relative to a first direction is calculated to determine a component of current to be measured.

12 Claims, 8 Drawing Sheets

DEVICE FOR MEASURING A COMPONENT OF CURRENT BASED ON MAGNETIC FIELDS

BACKGROUND OF THE INVENTION

The present invention relates to a probe for measuring a magnetic field of the type comprising at least one magnetoresistive or magnetoinductive sensor which is sensitive to the magnetic field along a predetermined selected measurement axis.

It is known to measure the magnetic field produced by an electronic circuit during operation by using a magnetoresistive sensor and, more precisely, a sensor of the GMR type (Giant Magnetic Resistor).

Magnetoresistive sensors of this type are electronic elements whose resistance varies in accordance with the magnetic field in which they are placed. A processing chain is connected to the magnetoresistive sensors and allows the magnitude of the magnetic field above the circuit to be determined.

Sensors of this type may be efficient but allow only a small amount of information to be obtained relating to the electromagnetic radiation produced by the electronic circuit. In particular, the characteristics of the current flowing in the circuit, in particular the magnitude thereof, the path which it follows and the flow direction thereof cannot be determined.

SUMMARY OF THE INVENTION

The object of the invention is to provide a probe for measuring a magnetic field which allows additional information to be obtained relating to the circuit which is analysed.

To this end, the invention relates to a probe for measuring a magnetic field of the above-mentioned type, characterised in that it comprises at least two magnetoresistive or magnetoinductive sensors which are rigidly connected to each other in a position such that their selected measurement axes are angularly offset, and the probe comprises output terminals which are specific to each magnetoresistive or magnetoinductive sensor in order to provide a signal which is representative of the magnetic field measured by each sensor along the selected measurement axis thereof.

According to specific embodiments, the measurement probe comprises one or more of the following features:

- it comprises at least two magnetoresistive or magnetoinductive sensors which are formed in the same semiconductor substrate, the two sensors having selected detection axes which are arranged perpendicularly relative to each other;
- it comprises at least three magnetoresistive or magnetoinductive sensors whose selected measurement axes are perpendicular in pairs;
- it comprises at least two pairs of magnetoresistive or magnetoinductive sensors, the sensors of each same pair having their selected axes parallel and offset relative to each other in a transverse direction relative to their selected measurement axes and the selected measurement axes of the sensors of two separate pairs are angularly offset,
- it comprises at least nine magnetoresistive or magnetoinductive sensors which are distributed in three triplets of three sensors, the three sensors of the same triplet having their selected measurement axes parallel and offset relative to each other in transverse directions relative to their selected measurement axes and the selected measurement axes of the sensors of separate triplets are angularly offset;
- all the magnetoresistive or magnetoinductive sensors of the probe are distributed in accordance with two layers;
- the selected measurement axes of the sensors of different layers are angularly offset;
- the sensors of the same layer have their selected measurement axes parallel; and
- all the magnetoresistive or magnetoinductive sensors of the probe are distributed on the same layer.

The invention further relates to a device for measuring a magnetic field comprising at least one probe as defined above, and a processing chain which is specific to each magnetoresistive sensor and means for processing the signals from the various processing chains.

BRIEF DESCRIPTION OF THE DRAWINGS

The invention will be better understood from a reading of the following description, given purely by way of example and with reference to the drawings, in which.

DETAILED DESCRIPTION OF THE PREFERRED EMBODIMENTS

Figure 1:
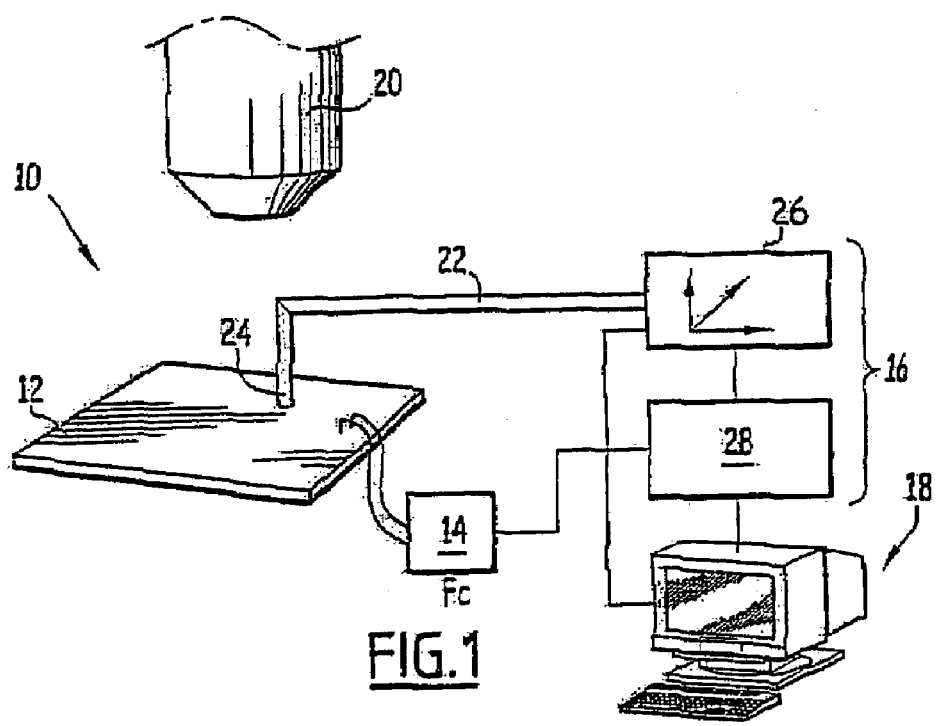
FIG. 1 is a perspective view of an installation for analysing an integrated circuit.

The installation illustrated in FIG. 1 is intended to analyse an integrated circuit during operation.

This installation substantially comprises a plate 12 for supporting an integrated circuit C, a circuit 14 for exciting the integrated circuit at a predetermined frequency designated FC, a device 16 for analysing the magnetic field produced by the circuit C during operation and means 18 for processing the results obtained at the output of the device 16 for analysing the magnetic field. Furthermore, the installation comprises means 20 for observing the integrated circuit during operation. These means are known per se and will not be described in detail.

The support 12 on which the circuit C is placed is formed by a plate of mumetal or comprises, in the lower portion thereof remote from the circuit, a plate of mumetal which forms a barrier to the magnetic field. Advantageously, the circuit C is confined in a case of mumetal.

The excitation circuit 14 is formed, for example, by a frequency generator which is capable of supplying the circuit with power at the predetermined frequency FC. This excitation frequency FC is, for example, 160 kHz.

The analysis means 16 comprise a manipulating arm 22 which is provided, at the free end thereof, with a measurement probe 24 which is capable of determining a value which is characteristic of the magnetic field at the location of the probe.

The manipulating arm 22 is connected to a mechanism 26 for displacing the probe which, as known per se, allows the probe to be displaced in three directions which are perpendicular relative to each other and allows the position of the probe relative to the circuit to be known in a precise manner.

Furthermore, the analysis means 16 comprise processing chains 28 to which the sensors of the probe 24 are connected in order to process the signal from the probe. These processing chains are connected to the processing means 18 to provide the means with one or more processed values of the magnetic field measured by the probe 724.

The processing means 18 are formed, for example, by a computer of the PC type which comprises input cards which are connected at the output of the processing chains 28. It further comprises control cards which allow the analysis means 16, and more precisely the displacement means 26, the processing chains 28 and the excitation circuit 14 to be controlled.

The processing means 18 comprise software modules which allow control of the means 16 for analysing the magnetic field, and in particular the excitation circuit 14, the displacement means 26 and the processing chains 28. They further comprise software modules for processing the signals from the field analysis means.

Figure 2:
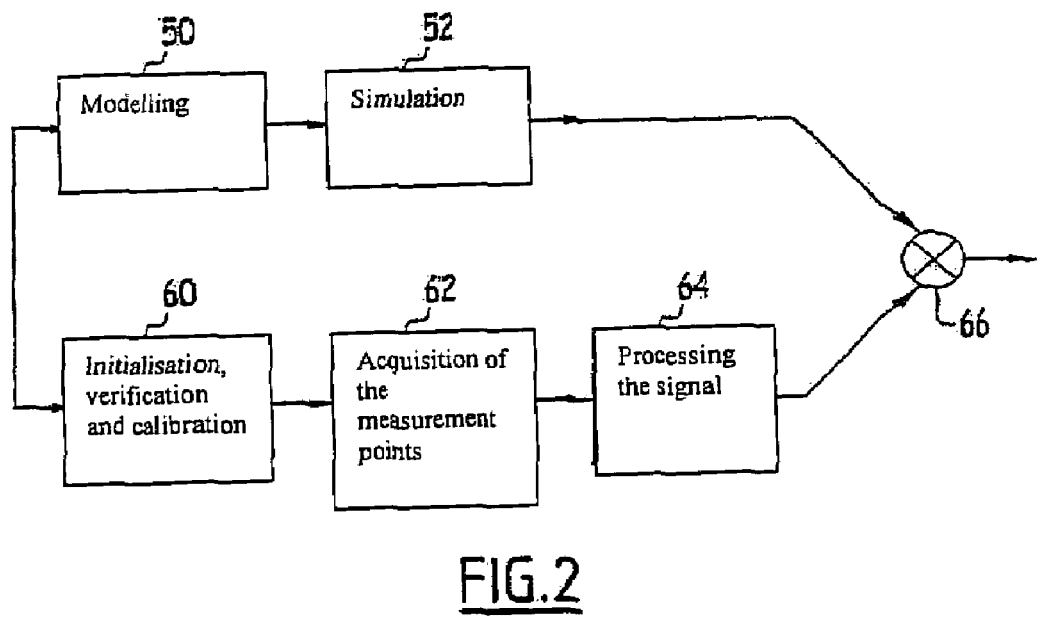
FIG. 2 is a flow chart explaining the operation of the installation of FIG. 1.

In particular, the processing means 18 are capable of implementing the algorithm illustrated in FIG. 2, a software module being provided for each step of the algorithm.

In order to analyse an electronic circuit during operation, a modelling of the circuit can first be carried out during step 50, based on the schematic representation of the circuit. This modelling, which is, for example, vectorial, is carried out using any appropriate software means. This modelling is intended to determine the position of the various tracks and various electronic components which constitute the circuit C.

When this modelling is complete, a simulation of the operation of the circuit is carried out during step 52. The characteristics of the magnetic field above the circuit are determined by this simulation, at each point of the circuit, in particular by applying Maxwell's equations. In this manner, for each element of the circuit, the current which is flowing therein, and the three components of the magnetic field designated $B_x$, $B_y$, and $B_z$ are determined, at a measurement point which is located immediately above the circuit and for different predetermined positions which can be occupied by the measurement probe 24.

In parallel with the modelling and simulation steps, the processing means 18 control effective measurement of the magnetic field using the field analysis means 16 at each relevant measurement point during the simulation.

During step 60, the field analysis means 16 are first initialised and calibrated. Their correct operation is also verified. Furthermore, reference measurements are carried out on a known calibration test-piece whose components of the magnetic field which it produces are known.

An acquisition of the various measurement points is then carried out during step 62. This step involves carrying out a measurement of at least one component of the magnetic field at several predetermined measurement points above the circuit C during operation. To this end, the probe is displaced under the control of the displacement means 26 in order to scan the surface of the circuit, for example, by following a boustrophedon type path. Before each acquisition of a measurement, the measurement probe is stopped at the measurement point so that the result of the measurement is not affected by the displacement of the probe.

The actual acquisition of each measurement will be described below.

Advantageously, but not necessarily, step 62 also provides for the acquisition of measurement points when the circuit C is not operational in order to measure at each measurement point the components(s) of the ambient magnetic field.

During step 64, the signal acquired for each measurement point is processed in order in particular to correct the errors and discrepancies resulting from the measurement, these errors and discrepancies being corrected by means of techniques involving comparison with the table of data acquired from a reference test-piece during step 60.

During step 64, values from the field measurements in one or more directions designated $B_x$, $B_y$, $B_z$ are calculated and in particular the spatial variations of the field components in the three directions designated $dB_x/dy$, $dB_x/dz$, $dB_y/dz$, $dB_y/dx$, $dB_z/dx$ and $dB_z/dy$.

Furthermore, the magnitude and direction characteristics of the current in the circuit below the measurement point are determined by applying Maxwell's law J=Rot B where J is the current vector and B is the magnetic field vector.

During step 66, the values from the signal processing step 64 and the values obtained following the simulation carried out during step 52 are compared in order to deduce whether the real operation of the circuit is correct or not and determine the zones of discrepancy between the theoretical circuit and the real circuit during operation.

Figure 3:
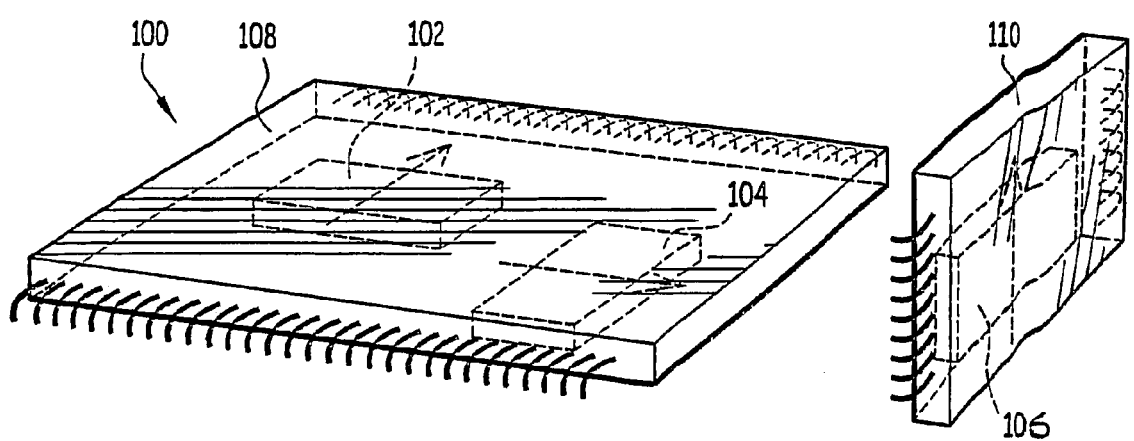
FIG. 3 is a schematic perspective view of an example of a measurement probe.

The measurement head 24 comprises a measurement probe 100 which is constituted, as illustrated in FIG. 3, by two integrated circuits which each comprise one or more magnetoresistive sensors. According to the invention, the measurement probe comprises at least two magnetoresistive sensors having selected measurement axes which are angularly offset. The sensors are rigidly connected to each other and are thus immobilised in their relative predetermined positions.

In the embodiment illustrated in FIG. 3, three magnetoresistive sensors 102, 104, 106 are integrated in the measurement probe.

For reasons of ease of production, the two magnetoresistive sensors 102, 104 are arranged in the same integrated circuit 108 whilst the magnetoresistive sensor 106 is arranged in a separate integrated circuit 110.

Each magnetoresistive sensor is a component whose resistance varies in accordance with the magnetic field in which it is located. A sensor of this type has a selected measurement axis which is illustrated schematically by an arrow in the Figures. The resistance of the component is thus influenced by the component of the magnetic field along this selected measurement axis, the component not being very sensitive to the components of the magnetic field in other directions.

As illustrated in FIG. 3, the selected measurement axes of the magnetoresistive sensors are perpendicular in pairs so that these axes define an orthogonal spatial reference.

Although such an arrangement of the axes is particularly advantageous, the selected measurement axes of the various sensors can be only angularly offset relative to each other, without them being perpendicular relative to each other.

The magnetoresistive sensor can be of the GMR type (Giant Magneto Resistive), GMI type (Giant Magneto Impedance), CMR type (Collossal Magneto Resistive) or TMR type (Tunneling Magneto Resistive). Preferably, the magnetoresistive sensor is of this last type. They may be, for example, sensors of the MTJ type (Magnetic Tunnel Junction) or SDT type (Spin Dependent Tunneling).

Figure 4:
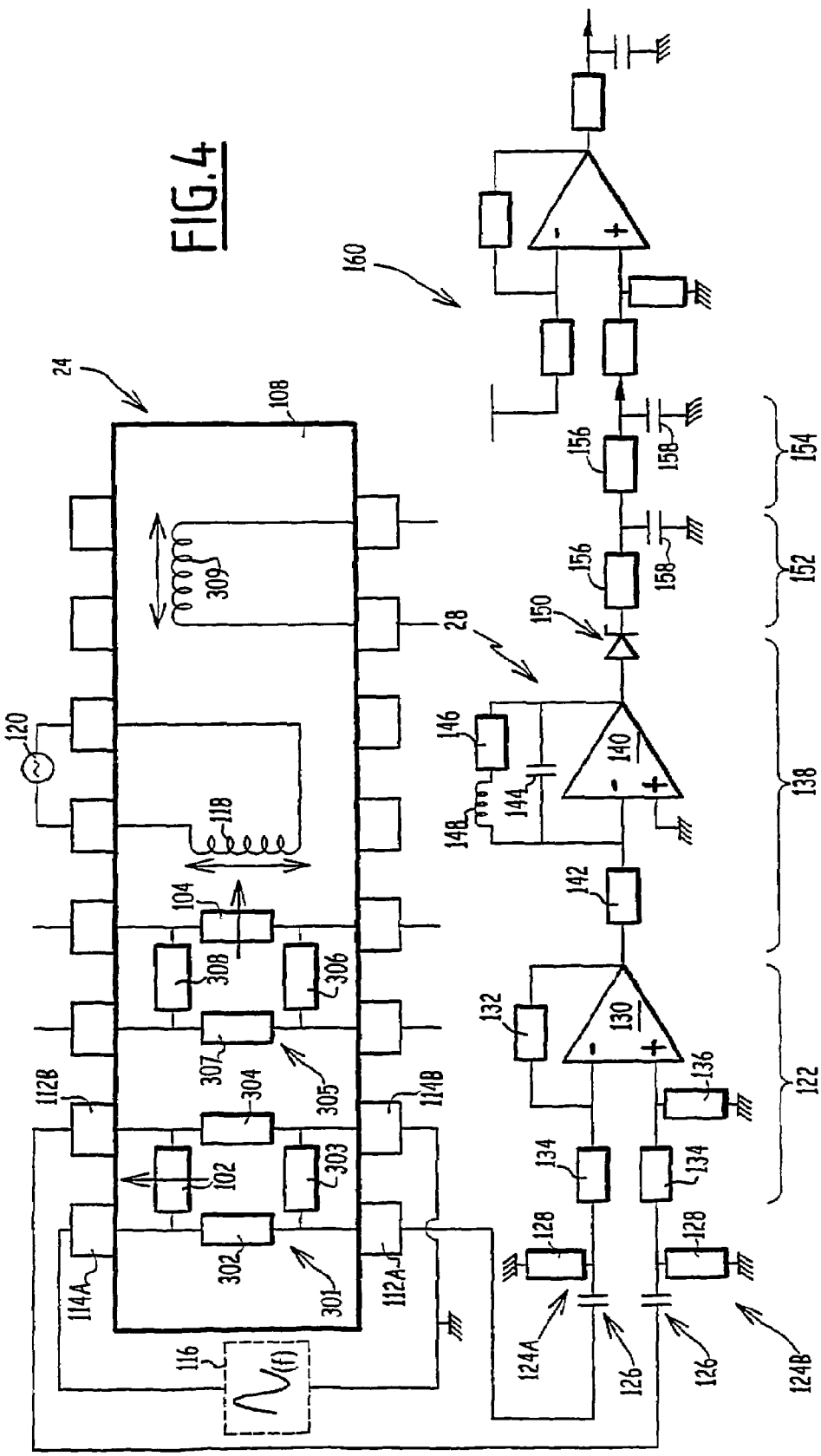
FIG. 4 is a schematic view of a first embodiment of a device for measuring a magnetic field according to the invention.

In FIG. 4, only the integrated circuit 108 which comprises the sensors 102 and 104 is illustrated. Furthermore, only the processing circuit 28 associated with the sensor 102 is illustrated, since an identical processing circuit is used for the sensor 104.

As illustrated in FIG. 4, the magnetoresistive sensor 102 is integrated in a Weston bridge 201 which comprises three other fixed resistors 302, 303, 304 having a predetermined value. The four resistors are connected in series in order to form a loop, as known per se in the structure of a Weston bridge. Two of the opposing terminals of the Weston bridge form measurement outputs 112A, 112B of the probe 100. The other two terminals 114A, 114B of the Weston bridge form power supply inputs for the Weston bridge. They are connected to the terminals of a generator 116 which produces a sinusoidal signal of a predetermined frequency, this frequency being, for example, equal to 160 kHz.

Furthermore, and as known per se, the measurement probe 100 comprises a winding 118 which is connected to an external source 120 of alternating voltage. The winding 118 is suitable for creating a polarisation field in the region of the magnetoresistive sensor in order to reduce the hysteresis of the sensor.

In the same manner, the magnetoresistive sensor 104 is also integrated in a Weston bridge 305 which comprises three resistors 306, 307, 308 and a second winding 309 is provided in order to create a polarisation field in the region of the magnetoresistive sensor 14 in order to reduce the hysteresis. As above, the Weston bridge and the winding are connected to specific power supply means which are not illustrated for reasons of simplification.

Only the circuit for processing the signals from the magnetoresistive sensor 102 is described below since the circuit connected to the sensors 104 is identical.

The outputs 112A, 112B of the measurement probe are connected to the processing chain 28.

They are connected, at the input, to a differential amplification stage 122 which forms a subtracter by means of two high-pass filters 124A, 124B, to the inputs of which the output terminals 112A and 112B are connected, respectively.

The differential amplification stage 122 is configured so as to produce a gain, for example, equal to 100.

The high-pass filters are passive filters of the RC type which comprise a capacitor 126, one terminal of which is connected to earth by means of a resistor 128.

The differential amplification stage is of any suitable known type and comprises, for example, an operational amplifier 130 whose feedback loop is provided with a resistor 132, the inverting and non-inverting inputs of the operational amplifier being connected to the outputs of the filters 124A, 124B by means of two input resistors 134. The non-inverting terminal of the operational amplifier is connected to earth by means of a resistor 136 which fixes an input voltage.

The output of the differential amplifier 120 is connected to the input of means 138 for isolating a predetermined frequency component of the signal which is representative of the magnetic field from the measurement probe. The frequency of the field component to be determined is designated FI. This frequency is, for example, equal to 160 kHz.

Figure 5:
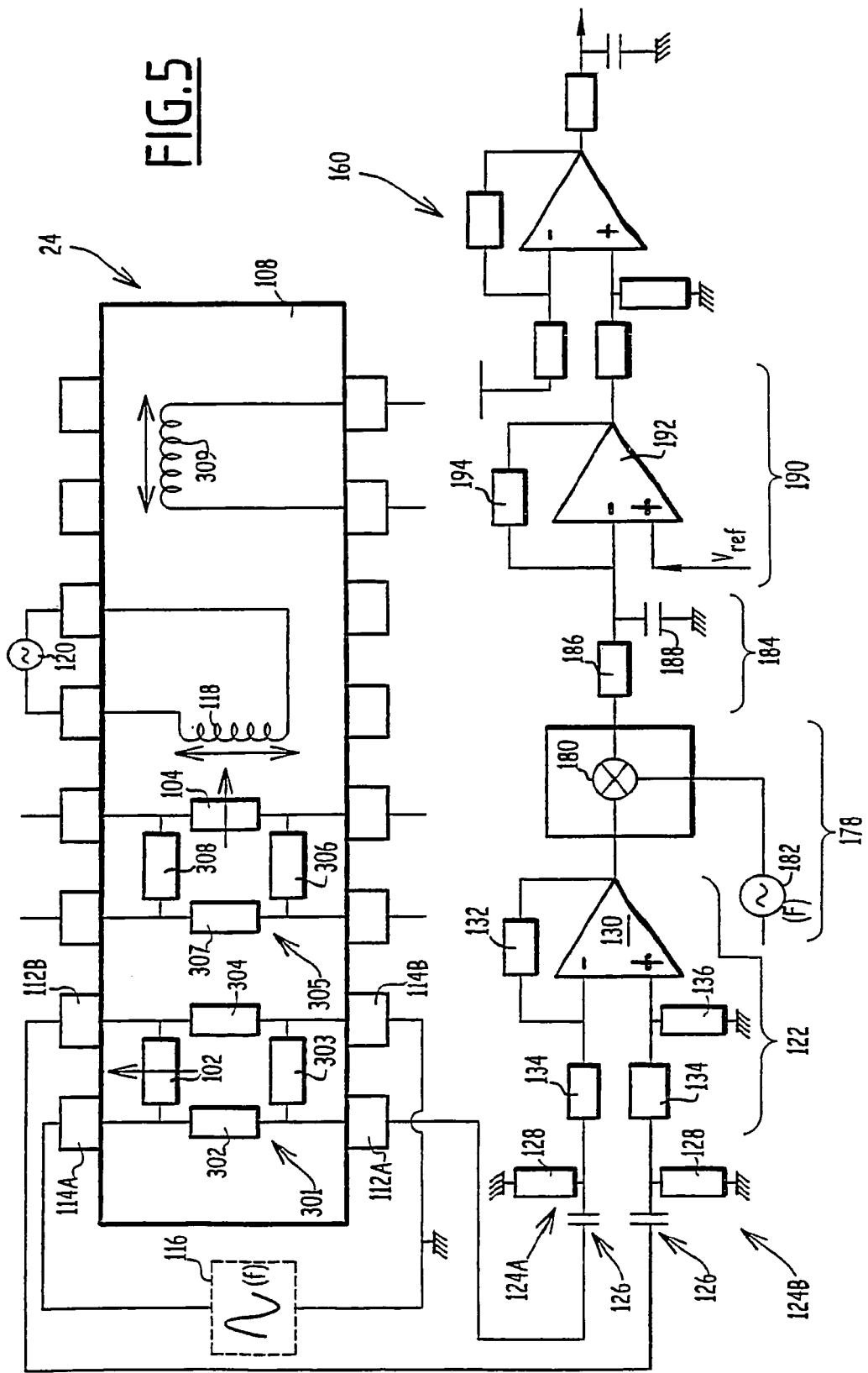
FIGS. 5 and 6 are views identical to those of FIG. 4 of the construction variant of a measurement device.

In the embodiment illustrated in FIG. 5, these isolation means 138 comprise an active selective filter of the band-pass type centred on the frequency FI of the frequency component to be isolated. This frequency is equal to the excitation frequency F of the circuit C.

This filter comprises an operational amplifier 140 whose non-inverting terminal is connected to earth. The inverting terminal of the filter is connected to the output of the differential amplification stage 122 by means of an input resistor 142. The feedback loop of the differential amplifier 140 comprises a capacitor 144 which is connected in parallel to a resistor 146, which is itself connected in series to a coil 148.

At the output, the selective filter 138 has a diode 150 of the BAT type followed by two passive low-pass filters 152, 154 which are each formed by a resistor whose output terminal is connected to earth by means of a capacitor 158.

The processing chain 28 allows the frequency component of the magnetic field detected by the magnetoresistive sensor to be obtained using a very simple circuit.

During operation of the device for measuring the magnetic field, the resistance value of the magnetoresistive sensor 102 varies in accordance with the magnitude of the magnetic field along the selected measurement axis of the sensor. The amplitude of the signal measured at the output terminals 112A, 112B thus varies in accordance with the magnetic field.

The two high-pass filters 124A, 124B bring about filtering of the interfering frequencies resulting from the external environment.

The differential amplification circuit 122 produces at the output a signal whose magnitude is proportional to the potential difference between the two terminals 122A, 122B. The selective filter 138 centered on the excitation frequency of the circuit C brings about the isolation of the frequency component of the field for this frequency.

The two low-pass filters 152, 154 bring about a new filtering operation which allows the interfering components to be suppressed.

An output step 160 can advantageously be added so as to output the continuous voltage value measured at the terminal of the non-loaded sensor. To this end, a differential amplifier is used again. The preceding output signal is applied to the inverting input of the differential amplifier whilst the continuous reference voltage is applied to the non-inverting input.

Control of the reference voltage is carried out by adjusting the value of the adjustable resistance so as to measure a zero value at the output of this second differential amplifier. The measurement is carried out by polarising the sensor magnetically (in order to offset in the hysteresis cycle) without polarising the circuit C.

The signal from the processing chain is received by the processing means 18.

In this manner, it will be understood that the processing chain allows a measurement value of the magnetic field and, more precisely, a component of the magnetic field to be obtained very quickly.

Figure 6:
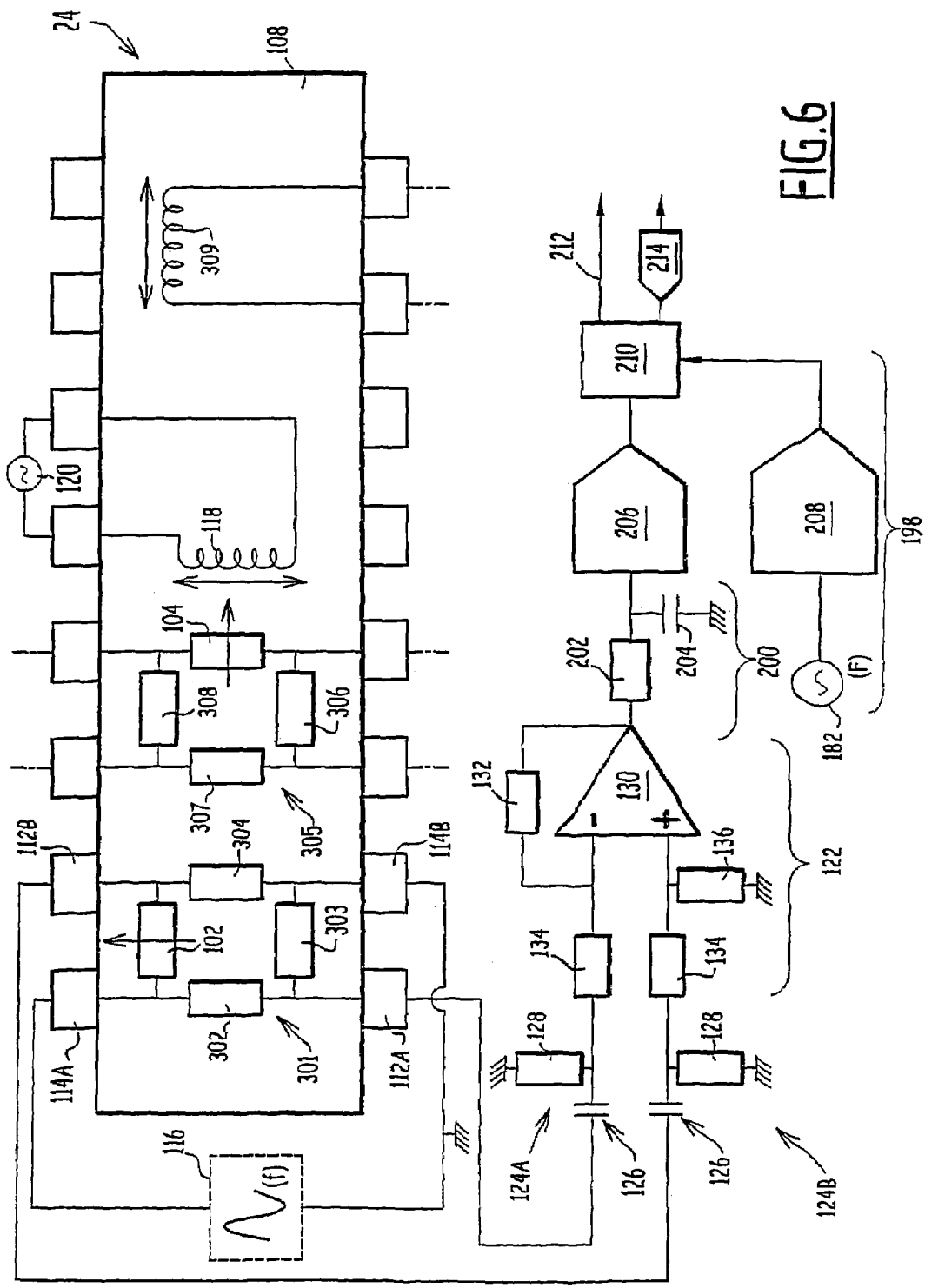

FIGS. 5 and 6 illustrate construction variants of a measurement device according to the invention. In these embodiments, elements which are identical or similar to those of FIG. 4 are indicated with the same reference numerals.

In these two construction variants, only the processing chain differs, owing to the means used downstream of the differential amplification stage 122.

In the two cases, the means for isolating the frequency component of the magnetic field for a predetermined frequency comprise a multiplication circuit 180 which allows the signal from the differential amplification stage 122 and a reference signal to be combined whose frequency FC is greater than or equal to the circuit operating frequency f imposed by the excitation circuit 14. The use of the multiplier provides flexibility with regard to the selection of the frequency (160 kHz).

In the embodiment of FIG. 4, the isolation means comprise an analogue multiplication circuit 180, one input of which is connected at the output of the differential amplification stage 122, and the other input of which is connected to a sinusoidal voltage generator 182 whose reference frequency F is greater than the predetermined frequency FI of the frequency component to be isolated.

A low-pass filter 184 constituted by a resistor 186 and a capacitor 188 is provided at the output of the multiplication circuit. Advantageously, a subtraction circuit 190 is provided at the output of the low-pass filter 184 in order to bring about the comparison of the filtered signal obtained at the output with an imposed reference signal designated Vref. The subtraction circuit comprises an operational amplifier 192 whose feedback loop has a suitable resistor 194, and to the non-inverting terminal of which a voltage Vref is applied.

As in the embodiment of FIG. 4, an output stage 160 is arranged at the output of the subtraction circuit.

According to a specific embodiment, the voltage source 182 is formed by the voltage source 116 which supplies the Weston bridge 201.

In this embodiment, the power supply frequency of the sensor is identical to the frequency of the frequency component sought.

In the embodiment of FIG. 6, the means for isolating the predetermined frequency component are formed by a digital processor which brings about the multiplication of the signal obtained at the output of the differential amplification stage 122 and a reference signal.

As illustrated in FIG. 6, a low-pass filter 200 constituted by a resistor 202 and a capacitor 204 is provided at the output of the differential amplification stage. An analogue/digital convertor 206 is connected at the output of the filter 200 in order to ensure that the signal is digitised.

Furthermore, the processing chain includes, as above, a sinusoidal reference voltage source which is also designated 182. An analogue/digital convertor 208 is connected at the output of this source 182. The analogue/digital convertors have a sampling frequency which is far greater than the frequency of the signals received. This is, for example, greater than 500 kHz.

A high-speed processor 210, such as a circuit of the DSP type, is provided in the processing chain. It receives at the input the signals from the two analogue convertors 206 and 208 and is programmed to bring about a multiplication of the two signals.

The multiplied signals are thus sent to the processing means 18, either via a digital connection, such as connection of the RS232 type designated 212, or via an analogue connection, a digital/analogue converter 214 being connected at the output of the processor 210.

In this case, the multiplication of the two signals is carried out by the processor 210. The subtraction operation carried out by the output stage 160 in FIGS. 3 and 4 is also brought about by the processor 210.

Using a measurement probe according to the invention, for each measurement position of the probe, three components of the magnetic field, designated $B_x$, $B_y$ and $B_z$, which correspond to three perpendicular directions of the field are stored, these three components of the magnetic field each being determined by a magnetoresistive sensor 102, 104, 106 associated with a specific processing chain.

The three components of the magnetic field are determined for each measurement point, which measurement points extend along the entire surface of the circuit to be analysed. These points are, for example, distributed over a regular matrix which covers the surface of the circuit. For the same position relative to the plane of the circuit, two measurement points are carried out at different distances relative to the surface of the circuit to be analysed.

Based on the three components of the magnetic field determined for adjacent points, the calculation means 18 determine, for each component, the derivative of the magnetic field relative to one direction, in particular by determining the difference between the values of the components of the magnetic field between these two points and by dividing this difference by the distance which separates the two points.

Based on these values, the processing means 18 are capable of calculating, for each measurement point, the three components which are characteristic of the current flowing in the circuit. These components of the magnetic field are determined by the following equations:

$$J_x = \frac{dB_z}{dy} - \frac{dB_y}{dz}$$

$$J_y = \frac{dB_x}{dz} - \frac{dB_z}{dx}$$

$$J_z = \frac{dB_y}{dx} - \frac{dB_x}{dy}$$

where $J_x$, $J_y$ and $J_z$ are the three components of the current along the three selected measurement axes of the sensors 102, 104 and 106.

Figure 7:
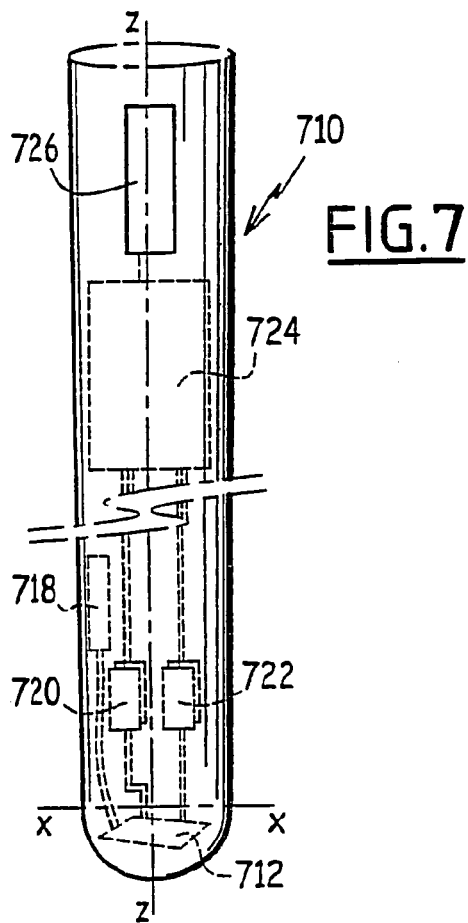
FIG. 7 is a schematic perspective view of a manual device for measuring a magnetic field which incorporates a bi-directional differential measurement probe.

FIG. 7 illustrates a portable device 710 for measuring the current flowing in a circuit in a single direction.

The device 710 is in the form of an elongate implement having an axis Z-Z whose shape and dimensions generally correspond to those of a pen. This device is therefore suitable for being manually displaced above the circuit during operation with the axis Z-Z thereof perpendicular relative to the circuit.

The device comprises, at one end, a probe 712 which comprises a plurality of magnetoresistive sensors which are arranged in two parallel planes perpendicular relative to the axis Z-Z.

Figure 8:
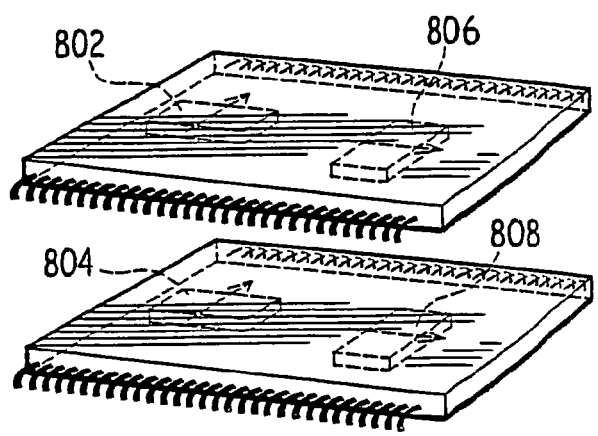
FIG. 8 is a schematic view of the measurement probe of the device of FIG. 7.

The probe 712 is illustrated at a larger scale in FIG. 8. It comprises four magnetoresistive sensors 802, 804, 806, 808 which are distributed in two pairs of sensors, the sensors of the same pair having their selected measurement axes parallel with each other. The selected measurement axes of the two sensor pairs are perpendicular relative to each other and thus extend in two main spatial directions which are both perpendicular relative to the axis Z-Z of the device.

The sensors of the same pair are offset relative to each other in a transverse direction relative to their common selected measurement axes. More precisely, the sensors of the same pair are offset along the axis Z-Z of the device.

In this embodiment, two sensors 802, 806 are arranged on a first integrated circuit, whilst two other sensors 804, 808 are arranged on another integrated circuit which is arranged parallel with the first. The sensors 602, 604, 606, 608 are thus distributed along two parallel planes.

The sensors 802 and 804 are offset along the axis Z-Z whilst their selected measurement axes extend along the axis Y-Y. In the same manner, the sensors 806, 808 are offset along the axis Z-Z but their selected measurement axes extend along the axis X-X which is perpendicular relative to the axes Y-Y and Z-Z.

The device 710 comprises means 718 for supplying the four sensors.

In the same manner, the probe 712 comprises output terminals which are specific to each sensor and which allow a signal to be received which is representative of the magnetic field measured by this sensor.

Each sensor is connected to a specific processing chain 720, 722 which allows the signal from the sensor to be processed. These processing chains are identical to one of the processing chains described in FIGS. 4, 5 and 6. They are connected to a data processing unit 24 which is capable of processing the signals which are representative of the components of the magnetic field obtained at the output of the processing chains 720, 722. The device further comprises a display screen 726 which is controlled by the data processing unit 724.

The screen 726 is capable of displaying the values of the two components $J_x$ and $J_y$ of the current flowing in the circuit above which the device 710 is placed perpendicularly relative to the plane of the circuit.

$J_x$ and $J_y$ are the values of the components of the current in the directions X-X and Y-Y which are specific to the probe and which correspond to the selected measurement axes of the sensors.

To this end, the data processing unit 724 determines the value of the derivative designated $$\frac{dB_x}{dz}$$

of the component of the magnetic field B along the axis X-X of the device relative to the longitudinal direction Z-Z which extends via the two sensors 806, 808.

At the output of the processing chains which are connected to the sensors 806, 808, two values of the component of the magnetic field B in the direction X-X are provided and designated $B_{x1}$ and $B_{x2}$. Based on these two measurement values and the known distance separating the sensors 806 and 808 measured along the axis Z-Z, the data processing unit 24 determines an evaluation of the derivative $$\frac{dB_x}{dz}$$

of the component of the magnetic field in the direction X-X relative to the direction Z-Z based on the relationship $$\frac{dB_x}{dz} = \frac{B_{x2} - B_{x1}}{z_2 - z_1}$$

where $z_2$ and $z_1$ are the positions of the sensors 14 and 12 along the axis Z-Z.

The value of the component $j_y$ of the current flowing in the circuit in the direction Y-Y, which is perpendicular relative to the two directions X-X and Z-Z is equal to $$\frac{dB_x}{dz}.$$

In a similar manner, the value $J_x$ of the current is obtained from the difference of the two field values $B_{y1}$ and $B_{y2}$ provided by the sensors 802, 804 and the known distance which separates them based on the relationship $$J_x = -\frac{dB_y}{dz} = \frac{B_{y1} - B_{y2}}{z_2 - z_1}.$$

The use of two planes of two sensors in the directions X-X and Y-Y allows current to be sought in the plane perpendicular relative to the axis Z-Z of the device. The differential field measurements between the sensors in pairs: $dB_x/dz$ and $dB_y/dz$ make it possible to derive the vectorial expression of the current with Maxwell's equations: Jx and Jy since dBz/dy and dBz/dx are zero if the current flows only in the plane perpendicular relative to the axis of the device.

Figure 9:
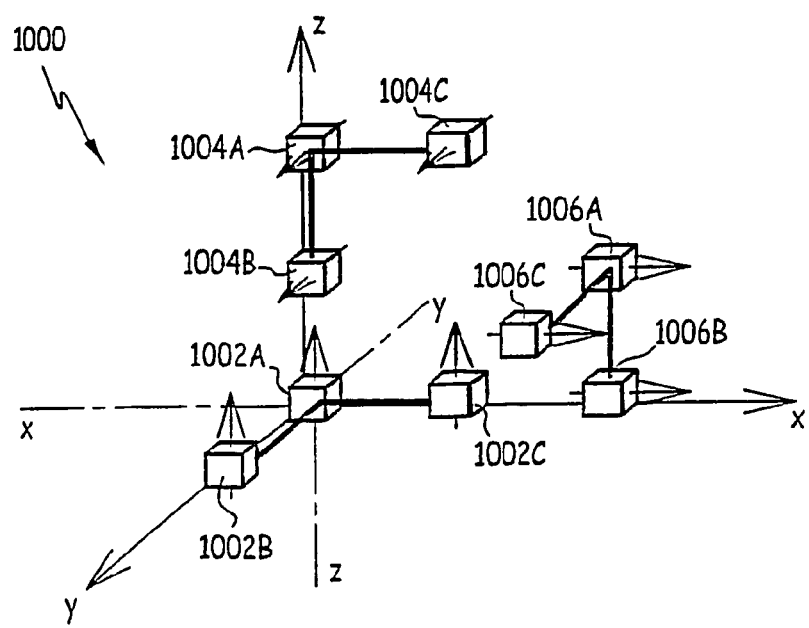
FIG. 9 is a schematic perspective view of a three-dimensional differential sensor which allows all the characteristics for a flowing current to be determined from the magnetic field produced by the flow of this current.

According to a specific embodiment of the installation of FIG. 1 or the device of FIG. 7, the measurement head 24 or 712 is constituted, for example, by a probe 1000 as illustrated in FIG. 9. This probe is suitable for carrying out a differential measurement of the field in three perpendicular directions in pairs.

A probe of this type comprises nine sensors. These nine sensors are distributed in the form of three triplets of sensors, the sensors of the same triplet having their selected measurement axes arranged parallel with each other. These sensors are further offset from each other in two directions which are perpendicular relative to the selected measurement axis which characterises the triplet.

More precisely, in the example illustrated in FIG. 9, three sensors 1002A, 1002B, 1002C have their selected measurement axes arranged parallel with the axis X-X. These sensors 1002A, and 1002B are offset relative to each other along the axis X-X whilst the sensors 1002A and 1002B are offset along the axis X-X. In the same manner, the sensors 1004A, 1004B, 1004C have their selected measurement axis parallel with the axis Y-Y, the sensor 1004C being offset from the sensor 1004A along the axis X-X whilst the sensor 1004B is offset from the sensor 1004A along the axis Z-Z. Finally, the three sensors 1006A, 1006B, 1006C have their measurement axis extending parallel with the axis X-X, the sensors 1006A and 1006B being offset relative to the sensor 1006A along the axis Z-Z and along the axis Y-Y, respectively.

In the installation described with reference to FIG. 1, each sensor is connected to a specific processing chain and the nine field values are supplied to the processing means 18. Furthermore, the processing means 18 know the distance which separates the various sensors of the same triplet in the directions which are perpendicular relative to the selected measurement axes of the sensors of this triplet. In this manner, for each measurement point, the processing means determine, from the components measured by the sensors, the variation of each component of the magnetic field in each of the directions. Based on these different variations, the various components designated $j_x$, $j_y$ and $j_z$ in the three perpendicular directions X-X, Y-Y and Z-Z of the current flowing in the circuit C which is being tested are calculated using the following relationship:

$$J_x = \frac{dB_z}{dy} - \frac{dB_y}{dz}$$

$$J_y = \frac{dB_x}{dz} - \frac{dB_z}{dx}$$

-continued $$J_z = \frac{dB_y}{dx} - \frac{dB_x}{dy}$$

It is envisaged that, with a device of this type, the current flowing in the circuit can be determined in a precise manner for each measurement point. By multiplying the measurement points, the structure of the circuit being tested can be reconstituted and the dynamic operation thereof can be analysed in a precise manner. Similar means are used in the portable device 710.

Figure 10:
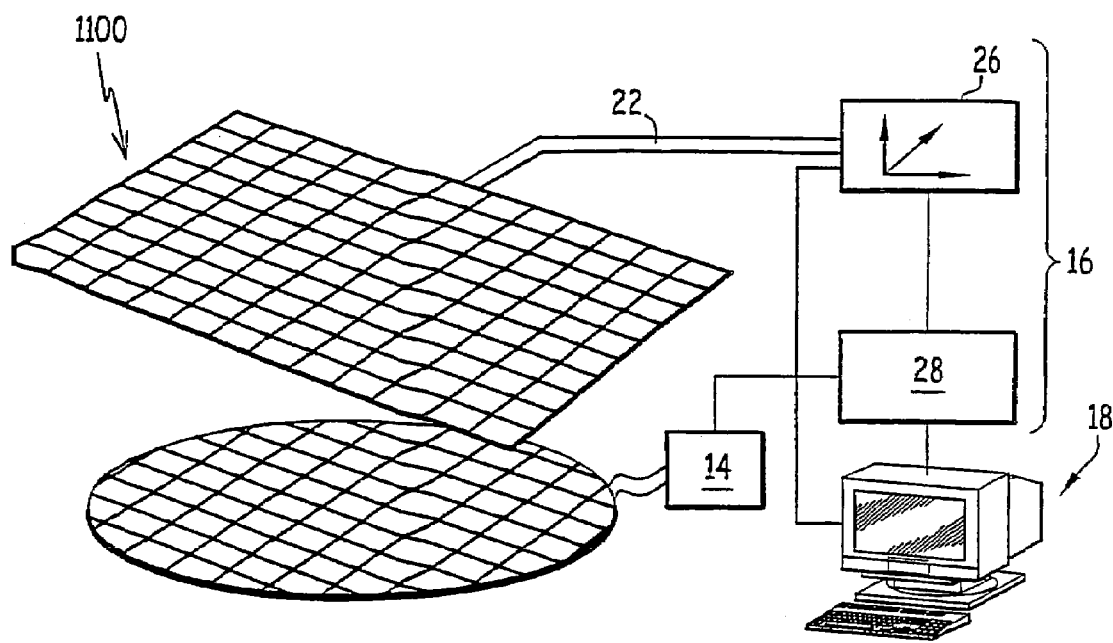
FIG. 10 is a test installation for a set of integrated circuits.

FIG. 10 illustrates a variant of FIG. 1. In this embodiment, the measurement head 24 is replaced by a matrix 1100 comprising a set of sensors which are arranged in a regular manner in the form of rows and columns. This matrix of sensors allows a set of integrated circuits carried by a silicon wafer 1102 to be tested, the circuits being arranged side by side. The matrix of sensors comprises sets of sensors which are distributed in rows and columns and which each correspond to a circuit to be tested belonging to the wafer 1102.

Figure 11:
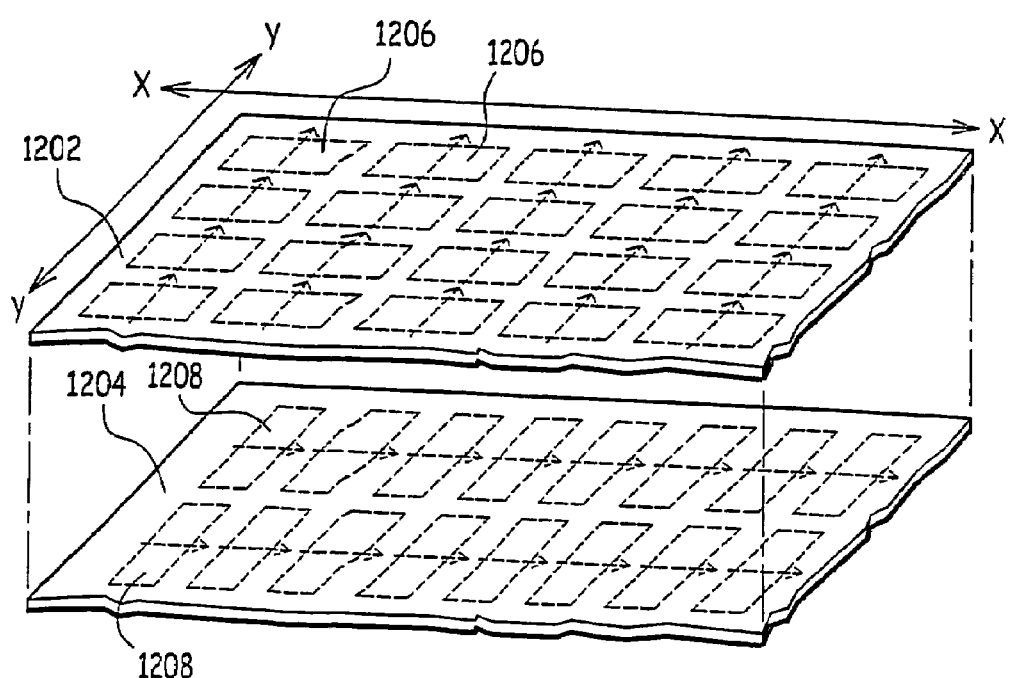
FIG. 11 is a schematic view of a first embodiment of a matrix measurement probe.

A set of sensors is partially illustrated in FIG. 11. Such a set of sensors comprises, for example, 5000 magnetoresistive sensors which are themselves arranged in rows and columns. Each of these sensors is connected to the analysis device by means of a specific processing circuit. The sets of sensors comprise sensors whose selected measurement axes are arranged parallel with each other in two directions which are perpendicular relative to each other. These perpendicular directions extend in a plane parallel with the general plane of the circuits to be tested. The component of the current perpendicular relative to the main plane of the circuit is generally of little interest.

This matrix is used in order to rapidly acquire an image of the magnetic field of a wafer of integrated circuits. For a matrix of a given size, the sensors will be distributed over two planes, one plane in direction X and the other plane in direction Y.

Advantageously, a second matrix which is identical to the one above is used, rotated through 90°. The lower plane, previously X, thus becomes plane Y and the upper plane becomes plane X. By using these two matrices, an assembly for measuring field X and field Y at two given altitudes Z is provided. By combining these measurements in a differential manner between the two altitudes, the expression of the current in accordance with Maxwell's equations is obtained.

In the embodiment of FIG. 11, the sensor matrix comprises two superimposed layers 1202, 1204. Each layer comprises a regular network of magnetoresistive sensors. The sensors 1206 of the first layer are arranged with their selected measurement axes parallel, the sensors being distributed in rows and in columns which are perpendicular relative to each other. In the same manner, the second layer comprises sensors 1208 whose selected measurement axes are parallel with each other and perpendicular relative to the measurement axes of the sensors of the first layer.

On the two layers, the sensors are spaced-apart from each other in a direction which is perpendicular relative to their selected measurement axis and which extends in the plane of the layer which carries the sensors of a known predetermined pitch. In this manner, in the region of each sensor, the processing means determine the components $j_x$ and $j_y$ of the current flowing in the main plane of the circuit based on the following relationships:

$$J_x = \frac{dB_y}{dz}$$

$$J_y = \frac{dB_x}{dz}$$

In order to obtain these values, the matrix is brought successively into two separate spacing positions in the direction Z-Z relative to the circuit to be tested. Measurements are carried out in these two positions which are separated by a spacing $d_z$ and the quantities $dB_y$ and $dB_x$ are calculated by subtracting the values measured.

Figure 12:
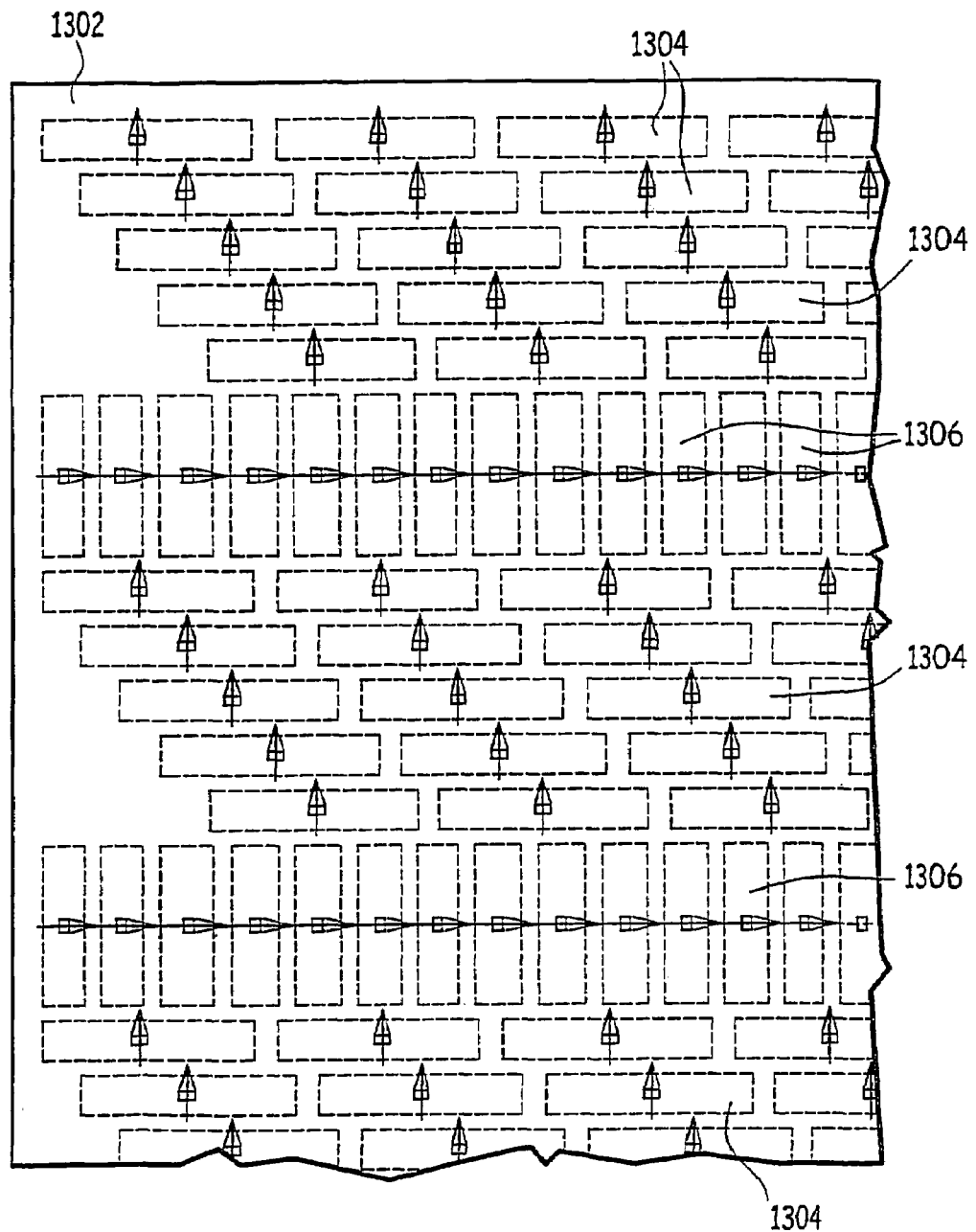
FIG. 12 is a schematic view of a second-embodiment of a matrix measurement probe.

FIG. 12 illustrates another embodiment of a probe according to the invention, this probe constituting a set of sensors of the sensor matrix 1100 of FIG. 10.

In this embodiment, the various magnetoresistive sensors are defined on the same layer 1302 of a super-conductive material. Each sensor has a rectangular form, the magnetoresistive element being formed only by the central portion of the sensor illustrated with a square in the Figure.

This probe is constituted by an alternate arrangement of a plurality of rows of sensors which have a selected measurement axis arranged in a first direction X-X and a row of sensors whose selected measurement axis extends along an axis Y-Y. More precisely, five rows of magnetoresistive sensors 1304 having their selected measurement axes parallel with the axis X-X are arranged in sequence along the axis X-X. The sensors are offset from one row to another by a distance equal to $\frac{1}{5}^{th}$ of the length of a magnetoresistive sensor, the length being taken perpendicularly relative to the selected measurement axis. The row of sensors designated 1306 whose selected measurement axis is orientated in the other measurement direction is constituted by an alignment of magnetoresistive sensors which are strictly aligned along the same axis.

This configuration takes into account the rectangular nature of the magnetoresistive sensors. In accordance with the size of the rectangle relative to the active field measurement element located at the centre of the rectangle, the ratio 1/5 is modified.

Advantageously, a second matrix is arranged so as to be parallel in a plane above the first. This second matrix is organised in a comparable manner but, alternatively, the set of sensors along the axis Y-Y is positioned above the set of sensors along the axis X-X and the sensors along the axis X-X above the sensors along the axis Y-Y. In this manner, a differential measurement between the sensors along the axis X-X between the two planes is obtained after scanning. The differential measurement is carried out in pairs between two measurements of a sensor along the axis X-X of a lower plane at a given location and a sensor along axis X-X of the upper plane at the same location. After scanning, the whole surface is covered by a measurement of the fields $B_x$ and $B_y$ on two planes (two altitudes z) at all points.

In a variant, the magnetoresistive sensors are replaced with magnetoinductive sensors.

The invention claimed is:

1. Device for measuring at least one component of a current comprising:
    at least one probe comprising a first and a second mangetoresistive or magnetoinductive sensors which are adapted to detect a first and respectively a second magnetic fields along a first and respectively a second predetermined selected measurement axes, the first and the second predetermined selected measurement axes having a first and respectively a second directions, the first and second sensors being rigidly connected to each other in a position such that the first and second measurement axes are at an angle other than zero, the probe further comprising output terminals which are specific to each sensor in order to provide a signal which is representative of the magnetic field measured by each of the sensors along the selected measurement axis thereof;

a computing device for determining a derivative of the first magnetic field relative to the second direction and a derivative of the second magnetic field relative to the first direction, the computing device calculating a difference between the derivative of the first magnetic field relative to the second direction and the derivative of the second magnetic field relative to the first direction, said difference being representative of a component of the current.

2. Device according to claim 1, wherein all the sensors of the probe are distributed on a same layer.

3. Device according to claim 1, further comprising:

a specific processing chain connected to each magnetoresistive sensor, each processing chain processing the signal from the magnetoresistive sensor; and means for processing the signals from each said processing chain.

4. Device according to claim 1, further comprising a mechanism for displacing the probe along the second direction from a first position to a second position, the probe measuring the first magnetic field at the first and second positions, the computing device determining:

a distance between the first and second positions, a difference between the first magnetic field at said first position and the first magnetic field at the second position, a ratio between said difference and said distance, said ratio being the derivative of the first magnetic field relative to the second direction.

5. Device according to claim 4, wherein the mechanism displaces the probe along the first direction between two positions, the probe measuring the second magnetic field at the two positions, the computing device determining:

a distance between the two positions, a difference between the second magnetic field at one of said two positions and the second magnetic field at another of said two positions, a ratio between said difference and said distance, said ratio being the derivative of the second magnetic field relative to the first direction.

6. Device according to claim 1, wherein the probe comprises a third and a fourth magnetoresistive or magnetoinductive sensors which are adapted to detect a third and respectively a fourth magnetic fields along a third and respectively a fourth predetermined selected measurement axes, the third and the fourth predetermined selected measurement axes being parallel to the first and respectively the second directions; the computing device calculating:

a difference between the first and the second magnetic fields, a distance between the first and the third sensors, a ratio between said difference and the distance between said first and third sensors, said ratio being the derivative of the first magnetic field relative to the second direction, a difference between the second and the fourth magnetic fields, a distance between the second and the fourth sensors, a ratio between said difference and the distance between said second and fourth sensors, said ratio being the derivative of the second magnetic field relative to the first direction.

7. Device according to claim 6, wherein the first and the second sensors are arranged on a first integrated circuit, the third and the fourth sensors are arranged on a second integrated circuit, the second integrated circuit being arranged parallel with the first integrated circuit.

8. Device according to claim 1, wherein the probe comprises a first semiconductor substrate, the first and the second sensors being formed in said first semiconductor substrate, the first and the second sensors having selected detection axes which are arranged perpendicularly relative to each other.

9. Device according to claim 8, wherein the sensors of the same layer have their selected measurement axes parallel.

10. Device according to claim 1, comprising two superimposed layers made of superconductive material, one of said superimposed layers comprising one part of the sensors, another of said superimposed layers comprising another part of the sensors.

11. Device according to claim 10, wherein the selected measurement axes of the sensors of different layers are at an angle other than zero.

12. Device according to claim 10, wherein the sensors of the same layer have their selected measurement axes parallel.

* * * * *